US012588274B2

(12) United States Patent
Elhami Khorasani

(10) Patent No.: US 12,588,274 B2
(45) Date of Patent: Mar. 24, 2026

(54) SEMICONDUCTOR STRUCTURES AND METHODS OF MANUFACTURING SEMICONDUCTOR STRUCTURES

(71) Applicant: SEMICONDUCTOR COMPONENTS INDUSTRIES, LLC, Phoenix, AZ (US)

(72) Inventor: Arash Elhami Khorasani, Phoenix, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 571 days.

(21) Appl. No.: 18/067,973

(22) Filed: Dec. 19, 2022

(65) Prior Publication Data

US 2024/0047577 A1     Feb. 8, 2024

Related U.S. Application Data

(60) Provisional application No. 63/370,312, filed on Aug. 3, 2022.

(51) Int. Cl.
| | |
|---|---|
| *H10D 84/00* | (2025.01) |
| *H10D 30/01* | (2025.01) |
| *H10D 30/65* | (2025.01) |
| *H10D 62/10* | (2025.01) |

(52) U.S. Cl.
CPC ....... *H10D 84/153* (2025.01); *H10D 30/0281* (2025.01); *H10D 30/655* (2025.01); *H10D 62/111* (2025.01); *H10D 62/116* (2025.01)

(58) Field of Classification Search
CPC ............. H10D 84/153; H10D 30/0281; H10D 30/655; H10D 62/111; H10D 62/116; H10D 8/411; H10D 30/603; H10D 62/307; H10D 62/378; H10D 64/516; H10D 84/811; H01L 21/761
See application file for complete search history.

(56) References Cited

U.S. PATENT DOCUMENTS

| | | | | |
|---|---|---|---|---|
| 9,761,707 B1 * | 9/2017 | Lin | ...................... | H10D 84/811 |
| 2005/0073007 A1 * | 4/2005 | Chen | ................... | H10D 30/603 |
| | | | | 257/E29.268 |
| 2006/0011974 A1 * | 1/2006 | Pendharkar | .......... | H10D 84/811 |
| | | | | 257/334 |

(Continued)

*Primary Examiner* — Galina G Yushina
(74) *Attorney, Agent, or Firm* — Kevin B. Jackson

(57) ABSTRACT

A semiconductor structure includes a region of semiconductor material of a first conductivity type. A doped region of a second conductivity type is within the region of semiconductor material at a first depth. A semiconductor device is in a first portion of the region of semiconductor material and includes a first current carrying region of the second conductivity type and a second current carrying region. A PN diode is in a second portion of the region of semiconductor material and includes a cathode region of the second conductivity type and anode region of the first conductivity type. The cathode region is coupled to the first current carrying region, the anode region is coupled to the doped region, and the doped region is configured to electrically isolate the semiconductor device from region of semiconductor material below the doped region in response to a forward bias applied to the semiconductor device.

20 Claims, 5 Drawing Sheets

10

(56)                    References Cited

U.S. PATENT DOCUMENTS

2006/0261408 A1*  11/2006  Khemka ................ H10D 8/411
                                                     257/E29.328
2010/0032756 A1    2/2010  Pendharkar et al.
2010/0038718 A1    2/2010  Zhu et al.
2014/0001546 A1    1/2014  Bode et al.
2014/0070315 A1*   3/2014  Levy ................. H01L 21/02233
                                                     438/286
2017/0250276 A1    8/2017  Gao et al.
2019/0148368 A1    5/2019  Agam et al.
2020/0328304 A1*  10/2020  Lin ....................... H01L 21/761

* cited by examiner

SEMICONDUCTOR STRUCTURES AND METHODS OF MANUFACTURING SEMICONDUCTOR STRUCTURES

CROSS-REFERENCE TO RELATED APPLICATIONS

This application claims priority from U.S. Provisional Patent Application No. 63/370,312 filed on Aug. 3, 2022, which is hereby incorporated by reference in its entirety.

TECHNICAL FIELD

The present disclosure relates, in general, to electronics and, more particularly, to semiconductor structures and methods of forming semiconductor structures.

BACKGROUND

Semiconductor technologies, such as Bipolar-CMOS-DMOS (BCD) technologies, are used in a broad range of products including power management and automotive applications. BCD technology combines the benefits of three process technologies within a single semiconductor component including bipolar technology for analog functions, CMOS (Complementary Metal Oxide Semiconductor) technology for digital functions, and DMOS (Double Diffused Metal Oxide Semiconductor) for power and high voltage functions. The combination of technologies provides, among other things, improved reliability, reduced electromagnetic interference and smaller die area.

Near term future demands in automotive BCD applications that use lateral-DMOS (LDMOS) switches require isolation of a first conductivity type (for example, N-type conductivity) drain region from a second conductivity type (for example, P-type conductivity) substrate. This requirement is particularly relevant in motor drive applications where inductive loads can generate a negative drain to source voltage (VDS) or push current through the source region of the LDMOS device. Absent appropriate drain isolation, under these operating conditions a substantial current can flow into the P-type conductivity substrate. Such current flow into the substrate can cause noise and latch-up in adjacent circuitry thereby perturbing integrated circuit (IC) functionality.

In the past, deep N-type buried regions with P-type epitaxial regions subsequently formed over the N-type buried regions have been used. However, such approaches are expensive and are often not feasible for larger diameter substrates (for example, 300 millimeters (mm) or greater) where certain process capabilities are lacking.

Accordingly, device structures and methods are needed that provide isolation of current carrying regions, such as LDMOS drain regions in BCD IC devices, from the underlying substrate. It would be beneficial for such device structures and methods to require minimal process modifications and to support reduced manufacturing costs.

Figure 1:
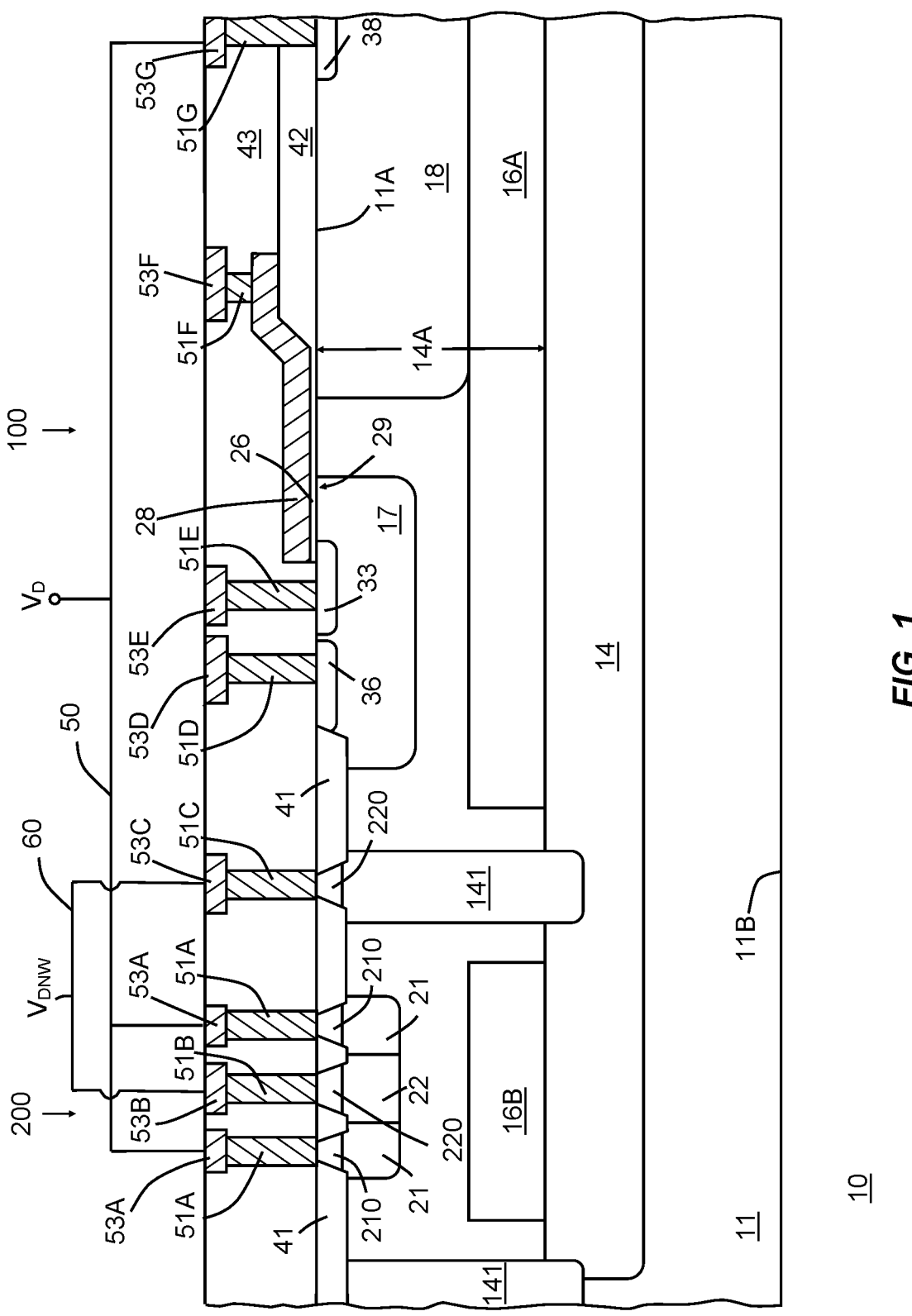
FIG. 1 illustrates a partial cross-sectional view of an example semiconductor structure in accordance with the present description.

The following discussion provides various examples of semiconductor structures and methods of manufacturing semiconductor structures. Such examples are non-limiting, and the scope of the appended claims should not be limited to the particular examples disclosed. In the following discussion, the terms "example" and "e.g." are non-limiting.

For simplicity and clarity of the illustration, elements in the figures are not necessarily drawn to scale, and the same reference numbers in different figures denote the same elements. Additionally, descriptions and details of well-known steps and elements are omitted for simplicity of the description.

For clarity of the drawings, certain regions of device structures, such as doped regions or dielectric regions, may be illustrated as having generally straight-line edges and precise angular corners. However, those skilled in the art understand that, due to the diffusion and activation of dopants or formation of layers, the edges of such regions generally may not be straight lines and that the corners may not be precise angles.

Although the semiconductor devices are explained herein as certain N-type conductivity regions and certain P-type conductivity regions, a person of ordinary skill in the art understands that the conductivity types can be reversed and are also possible in accordance with the present description, taking into account any necessary polarity reversal of voltages, inversion of transistor type and/or current direction, etc.

In addition, the terminology used herein is for the purpose of describing particular examples only and is not intended to be limiting of the disclosure. As used herein, the singular forms are intended to include the plural forms as well, unless the context clearly indicates otherwise.

As used herein, "current-carrying electrode" means an element of a device that carries current through the device, such as a source or a drain of an MOS transistor, an emitter or a collector of a bipolar transistor, or a cathode or anode of a diode, and a "control electrode" means an element of the device that controls current through the device, such as a gate of a MOS transistor or a base of a bipolar transistor.

The term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

The terms "comprises", "comprising", "includes", "including", "has", "have" and/or "having" when used in this description, are open ended terms that specify the presence of stated features, numbers, steps, operations, elements, and/or components, but do not preclude the presence or addition of one or more other features, numbers, steps, operations, elements, components, and/or groups thereof.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

Although the terms "first", "second", etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

It will be appreciated by one skilled in the art that words, "during", "while", and "when" as used herein related to circuit operation are not exact terms that mean an action takes place instantly upon an initiating action but that there may be some small but reasonable delay, such as propagation delay, between the reaction that is initiated by the initial action. Additionally, the term "while" means a certain action occurs at least within some portion of a duration of the initiating action.

The use of word "about", "approximately", or "substantially" means a value of an element is expected to be close to a state value or position. However, as is well known in the art there are always minor variances preventing values or positions from being exactly stated.

Unless specified otherwise, as used herein, the word "over" or "on" includes orientations, placements, or relations where the specified elements can be in direct or indirect physical contact.

Unless specified otherwise, as used herein, the word "overlapping" includes orientations, placements, or relations where the specified elements can at least partly or wholly coincide or align in the same or different planes.

It is further understood that the examples illustrated and described hereinafter suitably may have examples and/or may be practiced in the absence of any element that is not specifically disclosed herein.

DETAILED DESCRIPTION OF THE DRAWINGS

In general, the present examples relate to semiconductor structures and methods of making semiconductor structures, such as semiconductor structures comprising lateral diffused metal-oxide semiconductor (LDMOS) devices, which are configured to provide isolation between the drain regions and the underlying substrate. In some examples, the semiconductor structure comprises a double reduced surface field (double-RESURF) LDMOS device with an integrated protection diode. The integrated protection diode provides electrical isolation of the drain of the LDMOS device from the substrate. The integrated diode can occupy a small portion of the region for the LDMOS device portion and, thus, has minimal impact on the specific on-resistance (Rsp) of the LDMOS device. This is beneficial when the LDMOS device is used, for example, as a power switch. An example figure of merit for the present description includes an Rsp less than about 22 mohm·mm$^2$ for an LDMOS device capable of withstanding breakdown voltage (BV) of about 60 volts.

The structure and method do not require a deep buried N-type conductivity region or require a P-type conductivity epitaxial region formed over the deep buried N-type conductive region. The structure can be provided without additional processing steps in the process flow, can withstand negative voltages on the drain region, and can be provided with favorable breakdown voltage/on-resistance tradeoff characteristics. In some examples, the structures and method as suitable for higher voltage semiconductor devices, including 45 volt or higher semiconductor devices.

In an example, a semiconductor structure includes a region of semiconductor material of a first conductivity type, a first side, and a second side opposite to the first side. A first doped region of a second conductivity type opposite to the first conductivity type is within the region of semiconductor material spaced apart from the first side at a first depth. A semiconductor device comprises at least a first part that is in a first portion of the region of semiconductor material between the first doped region and the first side and comprising a first current carrying region of the second conductivity type and a second current carrying region. A PN diode is in a second portion of the region of semiconductor material and includes a cathode region of the second conductivity type and anode region of the first conductivity type. The cathode region is coupled to the first current carrying region of the semiconductor device, the anode region is coupled to the first doped region, and the first doped region is configured to suppress current injection from the semiconductor device into the region of semiconductor material below the first doped region in response to a forward bias applied between the first current carrying region and the second current carrying region. In some examples, the second current carrying region is within a second doped region of the first conductivity type.

In an example, a semiconductor structure includes a body of semiconductor material having a first conductivity type, a first side, and a second side opposite to the first side. A first doped region is within the body of semiconductor spaced apart from the first side and has a second conductivity type opposite the first conductivity type; A first semiconductor device is in a first portion of the body of semiconductor material between the first doped region and the first side. The first semiconductor device includes a second doped region of the second conductivity type adjacent to the first side, a first current carrying region of the second conductivity type within the second doped region, a third doped region of the first conductivity type adjacent to the first side and laterally spaced apart from the second doped region, a second current carrying region within the third doped region, and a fourth doped region of the first conductivity type vertically interposed between the second doped region and the first doped region. A second semiconductor device is in a second portion of the body of semiconductor material between the first doped region and the first side. The second semiconductor device includes a fifth doped region of the first conductivity type, and a sixth doped region of the second conductivity type. The fifth doped region and the sixth doped region comprise a first PN diode, the fifth doped region is coupled to the first current carrying region, and the sixth doped region is coupled to the first doped region.

In an example, a method includes providing a region of semiconductor material comprising a first conductivity type, a first side, and a second side opposite to the first side. The method includes providing a first doped region including a second conductivity type opposite to the first conductivity type within the region of semiconductor material spaced apart from the first side at a first depth. The method includes providing a semiconductor device comprising at least a first part in a first portion of the region of semiconductor material between the first doped region and the first side. The semiconductor device includes a first current carrying region of the second conductivity type and a second current carrying region. The method includes providing a PN diode in a second portion of the region of semiconductor material. The PN diode includes a cathode region of the second conductivity type and anode region of the first conductivity type. The cathode region is coupled to the first current carrying region of the semiconductor device and the anode region is coupled to the first doped region. The first doped region is configured to suppress current injection from the semiconductor device into the region of semiconductor material below the first doped region in response to a forward bias applied to the first current carrying region.

Other examples are included in the present disclosure. Such examples may be found in the figures, in the claims, or in the description of the present disclosure.

FIG. 1 illustrates a partial cross-sectional view of an example semiconductor structure 10 in accordance with the present description that is configured, among other things, to suppress current injection from a current carrying region at a top side and into an underlying substrate. Semiconductor structure 10 can also be referred to as an electronic structure, a semiconductor component, or an electronic component. Semiconductor structure 10 is shown as an N-channel LDMOS device, but it is understood that the structures and methods of the present description can be used for other types of semiconductor devices where the control of current injection into underlying structures is useful. In other examples, semiconductor structure 10 can be a P-channel LDMOS device by reversing the conductivity types of the various regions described. The doping information described below is suitable for an N-channel LDMOS device having a $BV_{DSS}$ greater than 45 volts. It is understood that other doping concentrations can be used to provide an LDMOS device with a different $BV_{DSS}$.

In accordance with the present description, semiconductor structure 10 includes a semiconductor device 100, which in the present example is a double RESURF LDMOS device. Semiconductor device 100 can also be referred to and is an example of a first semiconductor device. Semiconductor structure 10 further includes a semiconductor device 200, which in the present example is a PN diode. Semiconductor device 200 can be referred to and is an example of a second semiconductor device. In some examples, semiconductor structure 10 includes other semiconductor devices integrated with semiconductor device 100 and semiconductor device 200. In some examples, semiconductor structure 10 comprises a BCD integrated circuit structure manufactured using 65 nanometer (nm) processing technology. In other examples, semiconductor structure 10 comprises other types of IC devices and is manufactured using other processing technologies.

In accordance with the present description, semiconductor structure 10 comprises a region of semiconductor material 11, which may also be referred to as a body of semiconductor material, a semiconductor substrate, a semiconductor wafer, a work piece, or a starting substrate. In some examples, region of semiconductor material 11 can be an as-purchased semiconductor wafer, which may include a starting substrate and an optional epitaxial layer that may be included to provide a region of lower defects at the top side surface of the as-purchased semiconductor wafer. In some examples, region of semiconductor material 11 is devoid of any additional epitaxial layers formed after obtaining the starting substrate from a wafer supplier. In some examples, region of semiconductor material 11 does not utilize an epitaxial layer or epitaxial layers subsequently formed as part of a deep buried layer formation process. In the present example, semiconductor device 100 is in a first portion of region of semiconductor material 11 and semiconductor device 200 is in a second portion of region of semiconductor material 11. In some examples, the second portion can be a termination region of semiconductor structure 10. In some examples, semiconductor device 200 is laterally spaced apart from semiconductor device 100.

In some examples, region of semiconductor material 11 includes a first major surface 11A, which can also be referred to as a first side, a top side, or an active side. Region of semiconductor material 11 includes a second major surface 11B opposite to first major surface 11A. Second major surface 11B can also be referred to as a second side or a bottom side. In some examples, region of semiconductor material 11 comprises silicon and can have a P-type conductivity. In some examples, region of semiconductor material 11 is doped with boron and comprises a resistivity in a range from about 10 ohm-cm to about 40 ohm-cm. In some examples, P-type conductivity is an example of a first conductivity type. Region of semiconductor material 11 or a portion or portions thereof can comprise silicon, a IV-IV semiconductor material, a III-V semiconductor material, or combinations thereof.

In accordance with the present description, semiconductor structure 10 comprises a doped region 14 within region of semiconductor material 11 spaced apart from first major surface 11A at a first depth 14A. In some examples, first depth 14A is in a range from about 2.0 microns to about 6.0 microns. In some examples, first depth 14A is less than about 2.5 microns. As will be described in more detail later, doped region 14 is formed by selectively introducing dopant into region of semiconductor material 11 through first major surface 11A as opposed to forming doped region 14 by first introducing dopant into a substrate and then subsequently growing an epitaxial layer or layers over doped region 14. Doped region 14 comprises an N-type conductivity and can have a peak dopant concentration in a range from about $1.0 \times 10^{16}$ atoms/cm$^3$ to about $1.0 \times 10^{17}$ atoms/cm$^3$. In some examples, doped region 14 has a thickness from about 3 microns to about 6 microns. Doped region 14 is an example of a first doped region or a first ion implanted region and N-type conductivity is an example of a second conductivity type.

Semiconductor structure 10 comprises contact region(s) 141 extending inward from first major surface 11A and connected to doped region 14. Contact region 141 can also be referred to as a well region or a doped region. In some examples, contact region 141 can be a doped region with an N-type conductivity and can have peak dopant concentration greater than about $1.0 \times 10^{18}$ atoms/cm$^3$. In other examples, contact region 141 can be filled trench contact with the fill material comprising a doped polycrystalline semiconductor material, a silicide, combinations thereof, or other contact materials as known to one of ordinary skill in the art.

Semiconductor structure 10 comprises a doped region 16A and a doped region 16B within region of semiconductor material 11 spaced apart from first major surface 11A and interposed between doped region 14 and first major surface 11A. In the present example, doped regions 16A and 16B comprise a P-type conductivity and can have a peak dopant concentration in a range from about $1.0 \times 10^{16}$ atoms/cm$^3$ to about $1.0 \times 10^{17}$ atoms/cm$^3$. In some examples, doped region 16A forms part of semiconductor device 100 and doped region 16B is below semiconductor device 200. In some examples, part of contact region 141 can be interposed between doped region 16A and doped region 16B as generally illustrated in FIG. 1. Doped region 16A and doped region 16B can be formed using masking and ion implantation processes or other selective doping processes as known to one of ordinary skill in the art. In other examples, doped region 16A and doped region 16B can be a single continuous doped region between semiconductor device 100 and semiconductor device 200 with contact region 141 extending through the single continuous doped region to contact doped region 14. Doped region 16A is an example of a third or fourth doped region interposed or vertically interposed between a second doped region (e.g., doped region 18) and a first doped region (e.g., doped region 14). Doped region 16B is an example of a seventh doped region vertically interposed between semiconductor device 200 and a first doped region (e.g., doped region 14).

Semiconductor structure 10 includes a doped region 18 extending into region of semiconductor material 11 from first major surface 11A. Doped region 18 can also be referred to as a well region or a drift region for semiconductor device 100. In the present example, doped region 18 comprises an N-type conductivity and can be formed using ion implantation and anneal processes or other doping processes as known to one of ordinary skill in the art. In some examples, doped region 18 can be formed using multiple ion implants of different doses or energies to provide doped region 18 with a tailored dopant profile. In some examples, doped region 18 can be doped with phosphorous, can have a peak dopant concentration in a range from about $1.0 \times 10^{16}$ atoms/cm$^3$ to about $1.0 \times 10^{17}$ atoms/cm$^3$, and can have a depth in a range from about 1.0 micron to about 2.0 microns. In accordance with the present description, doped region 18 and doped region 16A form a double RESURF structure or region for semiconductor device 100. Doped region 18 is an example of a second doped region.

Semiconductor structure 10 includes a doped region 17 extending into region of semiconductor material 11 from first major surface 11A and laterally spaced apart from doped region 18. Doped region 17 can also be referred to as a well region. In the present example, doped region 17 comprises a P-type conductivity and can be formed using ion implantation and anneal processes or other doping processes as known to one of ordinary skill in the art. In some examples, doped region 17 can be doped with boron, can have a peak dopant concentration in a range from about $1.0 \times 10^{16}$ atoms/cm$^3$ to about $1.0 \times 10^{18}$ atoms/cm$^3$, and can have a depth in a range from about 1.0 micron to about 2.0 microns. Doped region 17 is an example of a third doped region.

Semiconductor structure 10 comprises a doped region 38 within doped region 18. In some examples, doped region 38 is configured as a current carrying electrode, a drain, or a drain region for semiconductor structure 10. Doped region 38 can be formed using ion implantation and anneal processes or other doping processes a known to one of ordinary skill in the art. In some examples, doped region 38 has a higher peak dopant concentration than doped region 18. Doped region 38 can be doped with phosphorous in accordance with typical CMOS process requirements. Doped region 38 is an example of a first current carrying region.

In some examples, a doped region 33 comprising an N-type conductivity is within doped region 17 and is configured as a current carrying electrode, a source, or a source region for semiconductor structure 10. A doped region 36 comprising a P-type conductivity is within doped region 17 adjacent to doped region 33. Doped region 36 can also be referred to as a body contact region and can abut doped region 33 or can be laterally spaced apart from doped region 33. Doped region 33 and doped region 36 can be formed using ion implantation and anneal processes or other doping processes as known to one of ordinary skill in the art. In some examples, doped region 33 can be doped with phosphorous and doped region 36 can be doped with boron in accordance with typical CMOS process requirements. In the present example, doped region 33 is an example of a second current carrying region.

In accordance with the present description, semiconductor structure 10 comprises doped region 21 and doped region 22 within region of semiconductor material 11 above doped region 16B and provide semiconductor device 200. In the present example, doped region 21 comprises a P-type conductivity and doped region 22 comprises an N-type conductivity. In accordance with the present example, doped region 21 and doped region 22 are configured as a PN diode. More particularly, doped region 21 provides an anode region for the PN diode and doped region 22 provides a cathode for the PN diode. In some examples, doped region 21 can be formed using the same processing steps as doped region 17 and doped region 22 can be formed using the same processing steps as doped region 18. This helps reduce manufacturing costs and cycle time. Doped region 21 is an example of anode region and doped region 22 is an example of a cathode region.

In some examples, the breakdown voltage of the PN diode (semiconductor device 200) can be less than the BV$_{DSS}$ of semiconductor device 100. In other examples, the breakdown voltage of the PN diode can be similar to the BVDSS of semiconductor device 100. Doped region 21 is an example of a fifth doped region and doped region 22 is an example of a sixth doped region. Semiconductor device 200 is an example of an integrated protection device or diode.

In some examples, doped region 21 can comprise a ring shape that surrounds doped region 22. In some examples, doped region 21 and doped region 22 can have other shapes, such as striped shapes or other shapes as known to one of ordinary skill in the art. In some examples, a doped region 210 comprising a highly doped P-type conductivity can be provided proximate to the surface of doped region 21 to enhance ohmic contact. In some examples, a doped region 220 comprising a highly doped N-type conductivity can be provided proximate to the surface of doped region 22 and contact region 141 to enhance ohmic contact.

Semiconductor structure 10 comprises a dielectric 41 over portions of first major surface 11A that includes openings to expose portions of doped regions 210 and 220. In some examples, dielectric 41 can comprise shallow trench isolation (STI), a LOCOS type isolation, or other isolation structures as known to one of ordinary skill in the art. In some examples, dielectric 41 comprises an oxide and has a thickness sufficient to support the breakdown voltage of the PN diode formed by doped region 21 and doped region 22. Dielectric 41 can also be referred to as an isolation or isolation region. Dielectric 41 is an example of a first dielectric.

Semiconductor structure 10 further comprises a gate dielectric 26 adjacent to first major surface 11A, doped region 33, a portion of doped region 17, a portion of region of semiconductor material 11, and a portion of doped region 18. In some examples, gate dielectric 26 comprises an oxide, a nitride, tantalum pentoxide, titanium dioxide, barium strontium titanate, high k dielectric materials, combinations thereof, or other related or equivalent materials known to one of ordinary skill in the art. In some examples, gate dielectric 26 is an oxide and has a thickness in a range from about 40 Angstroms to about 80 Angstroms.

In some examples, a dielectric 42 is adjacent to a portion of doped region 18 and in some examples can extend between gate dielectric 26 and doped region 38. In some examples, dielectric 42 has a thickness in a range from about 800 Angstroms to about 2000 Angstroms. In other examples, dielectric 42 has a thickness in a range from about 1000 Angstroms to about 1200 Angstroms. In one example, dielectric 42 has a thickness of about 1100 Angstroms. In some examples, the thickness of dielectric 42 is selected based on the desired $BV_{DSS}$ for semiconductor structure 10.

In some examples, dielectric 42 is an oxide formed as a deposited oxide using high temperature chemical vapor deposition (CVD). That is, dielectric 42 can be a high temperature oxide (HTO). In some examples, dielectric 42 is formed using atmospheric, low-pressure CVD (LPCVD), or plasma-enhanced (PECVD) process techniques. In some examples, dielectric 42 can be densified using an anneal process (for example, about 750 to about 900 degrees Celsius) after dielectric 42 is formed. In other examples, dielectric 42 can be a nitride, combinations of oxide and nitride, or other dielectrics as known to one of ordinary skill in the art. In some examples, dielectric 42 is undoped. In some examples, dielectric 42 has an edge that this proximal to gate dielectric 26, which can be sloped or tapered as generally illustrated in FIG. 1. This helps provide good step coverage for a gate conductor 28, which is described next. Dielectric 42 is an example of or can be referred to as a second dielectric. In some examples, dielectric 41 can be used instead of dielectric 42 over semiconductor device 100.

In some examples, gate conductor 28 is over gate dielectric 26 and extends to overlap a portion of dielectric 42. That is, gate conductor 28 is over gate dielectric 26 and is over a portion of dielectric 42. In some examples, gate conductor 28 is a continuous structure over its lateral width across gate dielectric 26 to the portion of dielectric 42 as generally illustrated in FIG. 1. In some examples, gate conductor 28 overlies portions of region of semiconductor material 11, such as a portion of doped region 18 as illustrated in FIG. 1. That portion of gate conductor 28 over gate dielectric 26 is configured to control the flow of current between doped region 33 and doped region 38 by establishing a channel region 29 in region of semiconductor material 11 in accordance with an applied gate voltage.

In some examples, gate conductor 28 comprises one or more conductive materials, such a metal, a silicide, a doped polycrystalline semiconductor material, combinations thereof, or other conductive materials as known to one of ordinary skill in the art. In some examples, gate conductor 28 comprises polysilicon doped with an N-type conductive dopant. Gate conductor 28 can be formed using deposition techniques including CVD processes and can be patterned using photolithographic and etch processes. In some examples, gate conductor 28 has a thickness in a range from about 1000 Angstroms to about 2400 Angstroms. In some examples, when gate dielectric 26 comprises a high K dielectric, gate conductor 28 can comprise a metal. Gate conductor 28 can also be referred to as a gate electrode or a conductor.

In some examples, a dielectric 43 is formed over gate conductor 28, dielectric 41, and dielectric 42. In some examples, dielectric 43 comprises one or more dielectric materials, such as oxides, nitrides, combinations thereof, or other dielectric materials as known to one of ordinary skill in the art. In some examples, dielectric 43 is an oxide that can be a doped oxide or an undoped oxides or combinations of layers that are doped and undoped. In some examples, dielectric 43 has a thickness to accommodate a desired number of conductors and can be formed using CVD processes or other processes as known to one of ordinary skill in the art. In some examples, dielectric 43 has a thickness of 6000 Angstroms or more. Dielectric 43 can also be referred to as an inter-layer dielectric (ILD). Dielectric 43 is an example of or can be referred to as a third dielectric.

Semiconductor structure 10 further comprises conductive vias 51A, 51B, 51C, 51D, 51E, 51F and 51G extending through dielectric 41 and dielectric 42. In the present example, conductive via(s) 51A is coupled to doped region 210 and doped region 21, conductive 51B is coupled to doped region 220 and doped region 22, conductive via 51C is coupled to contact region 141, conductive via 51D is coupled to doped region 36, conductive via 51E is coupled to doped region 33, conductive via 51F is coupled to gate conductor 28, and conductive via 51G is coupled to doped region 38. Conductive vias 51A-51G can also be referred to as conductive interconnects. In some examples, semiconductor structure 10 further comprises a conductor 53A coupled to conductive via(s) 51A, a conductor 53B coupled to conductive via 51B, a conductor 53C coupled to conductive via 51C, a conductor 53D coupled to conductive via 51D, a conductor 53E coupled to conductive via 51E, a conductor 53F coupled to conductive via 51F, and a conductor 53G coupled to conductive via 51G.

In some examples, conductive vias 51A-51G and conductors 53A-53G comprise one or metals, such as copper (for example, with a barrier structure), copper alloys (for example, with a barrier structure), or other conductive materials as known to one of ordinary skill in the art. In some examples, conductive vias 51A-51G can be tungsten plugs or similar structures as known to one of ordinary skill in the art. In some examples, conductors 53A-53G and conductive vias 51A-51G can be formed using evaporation, sputtering, plating, or other deposition techniques as known to one of ordinary skill in the art. In some examples, conductors 53A-53G can have a thickness in a range from about 0.2 microns to about 0.5 microns. In some examples, conductive vias 51A-51G can be different materials than conductors 53A-53G. Photolithographic and etch processes can be used to pattern conductors 53A-53G. In some examples, conductive vias 51A-51G and conductors 53A-53G can be formed at the same time by forming openings in dielectric 43 to expose portions semiconductor structure 10, and then depositing conductive material over dielectric 43 and into the openings. In other examples, conductive vias 51A-51G are formed first and then conductors 53A-53G are formed.

In accordance with the present description, conductor 53A is electrically coupled to conductor 53G as represented by line 50. In this way, doped region 21, which is the anode of the PN diode is coupled to doped region 38 and is at the same potential $V_D$ as doped region 38. In addition, conductor 53B is electrically coupled to conductor 53C as represented as represented by line 60. In this way, doped region 22, which is the cathode of the PN diode is coupled to contact region 141 and doped region 14 so that doped region 14 is as the same potential $V_{DNW}$ as doped region 22. It is understood that the electrical coupling of conductor 53A to conductor 53G and the electrical coupling of conductor 53B to conductor 53C can be done using conductive interconnect as part of another metal layer or layers over semiconductor structure 10.

In accordance with the present description, when $V_D$ is a positive voltage, the PN diode (i.e., semiconductor device 200) is forward biased and $V_{DNW}$ (which is applied to doped region 14) is equal to $V_D$ and the double RESURF provided by doped region 16A and doped region 18 allows the LDMOS device to withstand its rated $BV_{DSS}$. It was found in practice with the above noted doping concentrations to provide a 45 volt LDMOS device, the LDMOS device withstood 60 volts and had a low specific on-resistance ($R_{SP}$) of 20 mohm·mm$^2$.

When $V_D$ is a negative voltage, the PN Diode is reversed biased and $V_{DNW}$ (which is applied to doped region 14) is equal to 0 volts. Under this condition, doped region 14 isolates semiconductor device 100 from region of semiconductor material 11 below doped region 14 and the body diode formed by doped region 17 and doped region 18 is forward biased and carries the current for the LDMOS device. In this way, semiconductor structure 10 avoids issues such as noise and latch-up in adjacent circuitry to avoid perturbing the functionality of semiconductor structure 10. More particularly, semiconductor structure 10 as described herein allows the isolation of first semiconductor device 100 from the underlying substrate without any additional epitaxial growth steps after doped region 14 is formed and provides desired $BV_{DSS}$ and $R_{SP}$ performance.

Figure 2:
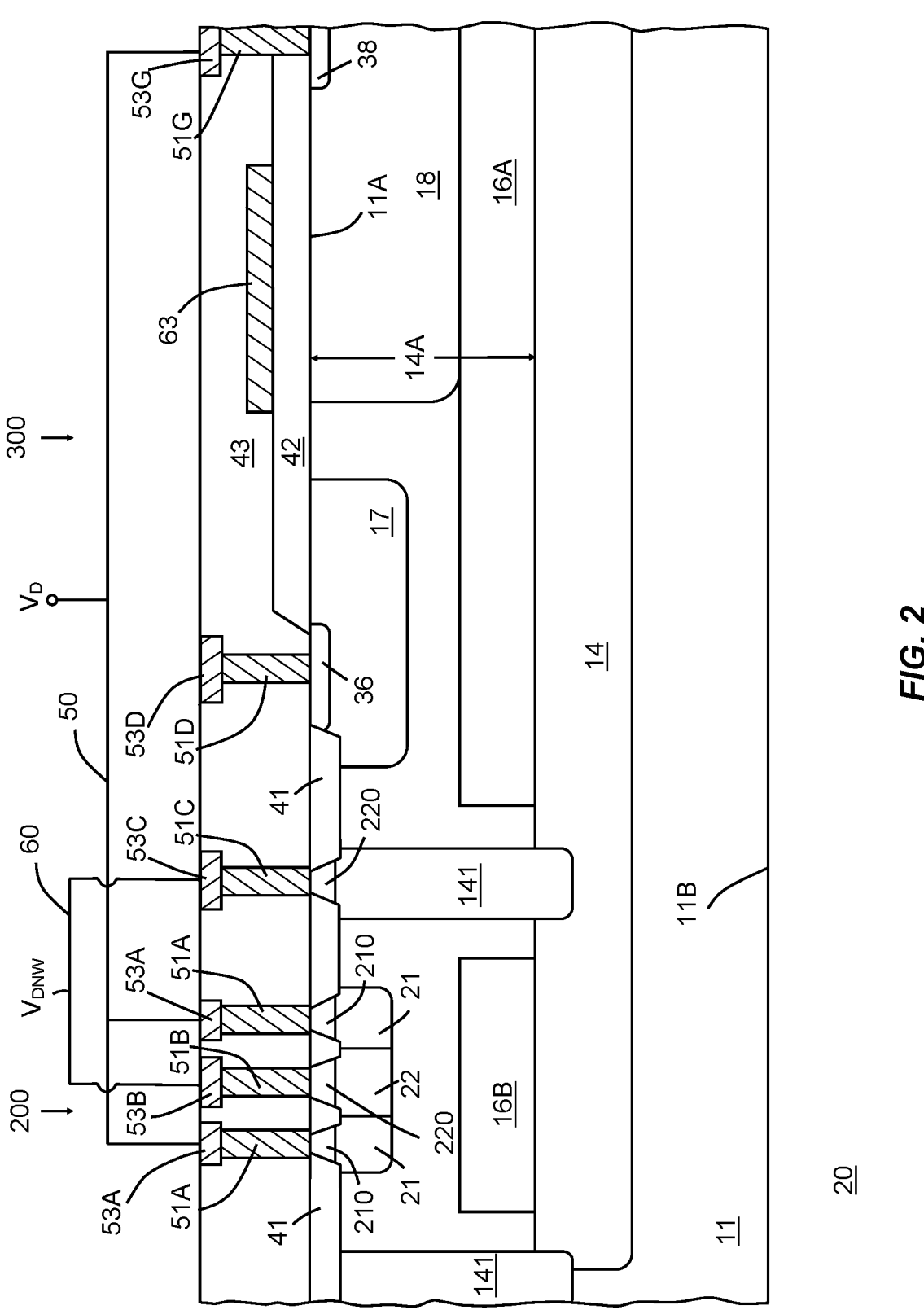
FIG. 2 illustrates a partial cross-sectional view of an example semiconductor structure in accordance with the present description.

FIG. 2 illustrates a partial cross-sectional view of an example semiconductor structure 20 in accordance with the present description. Semiconductor structure 20 has some similarity in construction to semiconductor structure 10 and such similarity will not be repeated here. In this regard, only the distinctions between semiconductor structure 20 and semiconductor structure 10 will be described.

In the present example, semiconductor structure comprises semiconductor device 200 configured as a first PN diode and comprises a semiconductor device 300. In some examples, semiconductor device 300 comprises a second PN diode. In some examples, semiconductor device 300 comprises doped region 36 within doped region 17 but can be provided without doped region 33. Dielectric 42 can extend to laterally overlap doped region 17 and a portion of doped region 36. In the present example, doped region 36 and doped region 17 provide a cathode region for semiconductor device 300 and doped region 18 and doped region 38 provide an anode for semiconductor device 300. Semiconductor device 300 is an example of a first semiconductor device. In some examples, semiconductor device 300 and semiconductor device 100 are included as part of the same semiconductor structure.

In accordance with the present description, when $V_D$ is a positive voltage, the first PN diode (i.e., semiconductor device 200) is forward biased and $V_{DNW}$ (which is applied to doped region 14) is equal to $V_D$ and the double RESURF provided by doped region 16A and doped region 18 allows the second PN diode (i.e., semiconductor device 300) to achieve its specified breakdown voltage. When $V_D$ is negative, the second PN diode is under forward bias. and the first PN diode is under reverse bias. In this case, $V_{DNW}$ (which is applied to doped region 14) is 0 volts and doped region 14 isolates the second PN diode from the underlying region of semiconductor material 11 so that current flow is predominately from doped region 36 to doped region 38.

Figure 3:
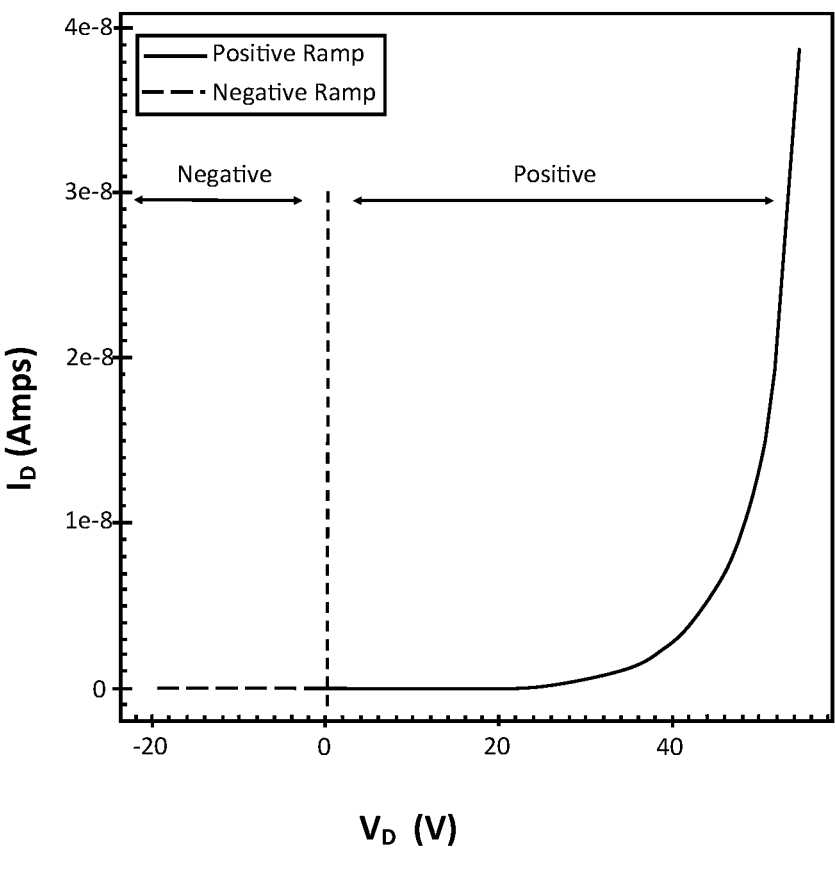
FIG. 3 graphically illustrates drain current ($I_D$) as a function of drain voltage ($V_D$) for a semiconductor structure in accordance with the present description.

FIG. 3 graphically illustrates drain current ($I_D$) as a function of drain voltage ($V_D$) for a semiconductor structure in accordance with the present description. More particularly, with $V_D$ under positive ramp, $V_{DNW}$ equals $V_D$ and doped region 16A and doped region 18 act as a double RESURF structure that allows the LDMOS device to withstand a higher $BV_{DSS}$ while achieving an $R_{SP}$ of about 20 mohm·mm2. When $V_D$ is under a negative ramp, the amount of drain current measured in the underlying region of semiconductor material 11 is negligible as shown in FIG. 3.

Thus, it is seen that doped region 14 isolates the drain current when the PN diode (i.e., semiconductor device 200) is reversed biased.

Figure 4:
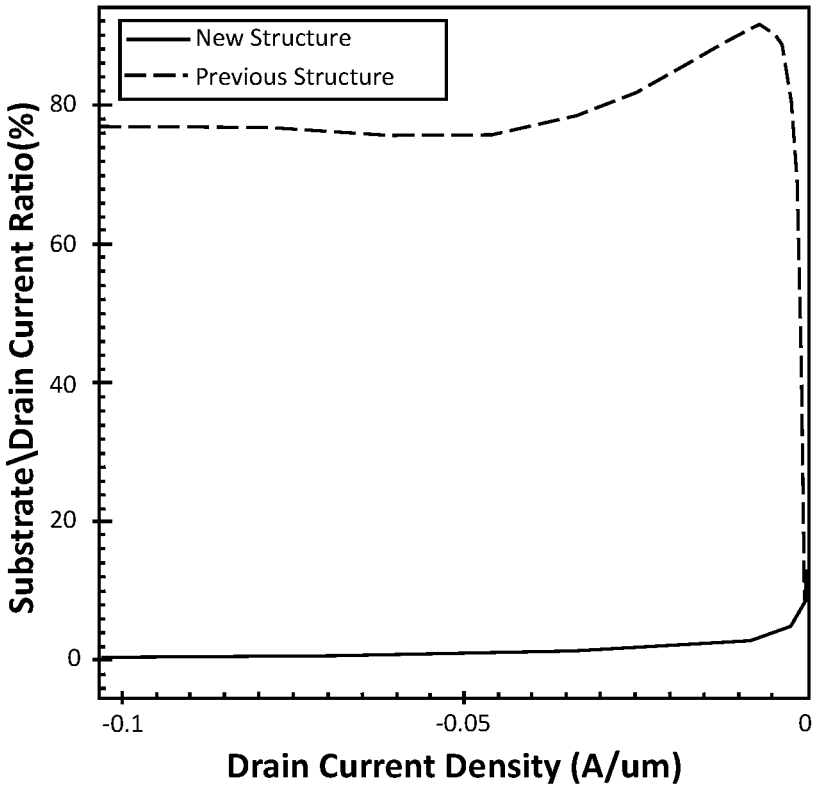
FIG. 4 graphically illustrates substrate/drain current ratio as a function of drain current density comparing a semiconductor structure of the present description with a previous structure.

FIG. 4 graphically illustrates substrate/drain current ratio in percent as a function of drain current density comparing a semiconductor structure of the present description with a previous structure. More particularly, FIG. 4 graphically illustrates the percentage of forward current from the body diode that is directly injected into the underlying region of semiconductor material. The semiconductor structure in accordance with the present description is represented by the solid line in FIG. 4, and the previous structure that does not include at least semiconductor device 200 and doped region 14 is represented by the dashed line in FIG. 4. As shown in FIG. 4, the semiconductor structure in accordance with the present description greatly reduces the percent injected from about 80% to less than about 1% to 5%. More particularly, the semiconductor structure in accordance with the present description suppresses current injection from semiconductor device 100 into region of semiconductor material 11 below doped region 14.

Figure 5:
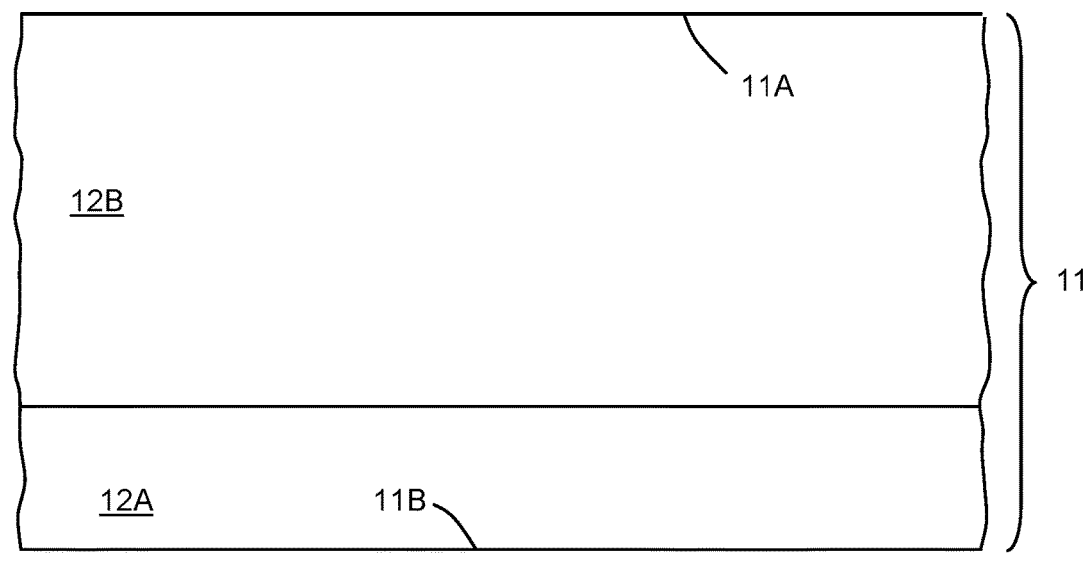
FIGS. 5 and 6 illustrate partial cross-sectional views of a semiconductor structure at different steps in fabrication in accordance with the present description.
Figure 6:
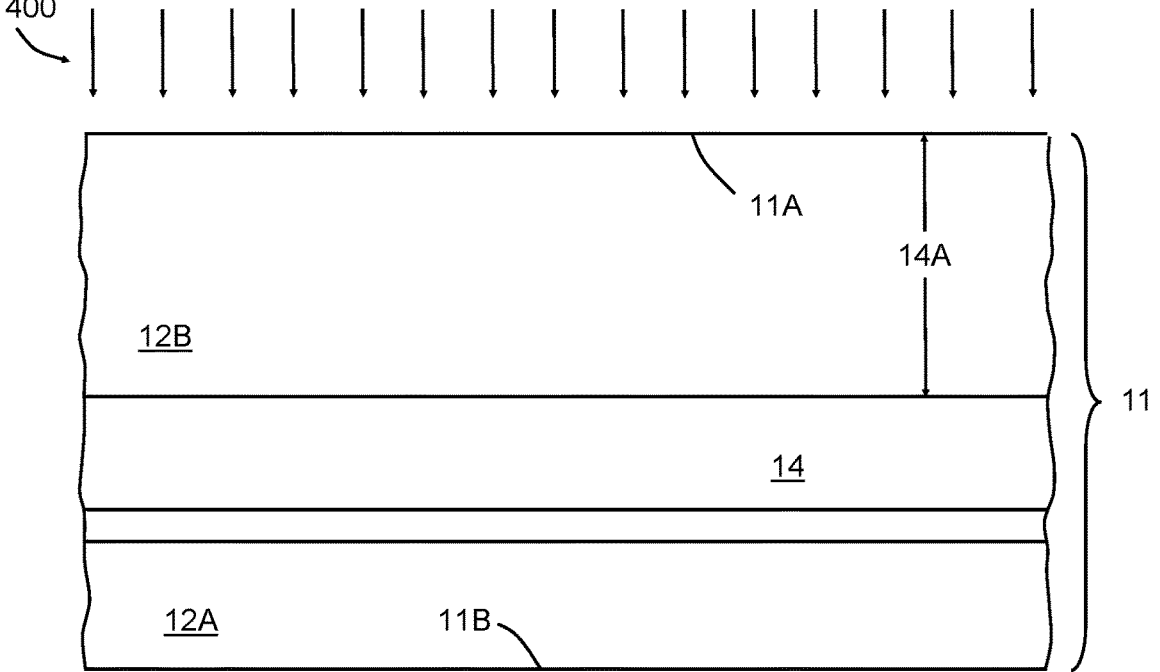

FIGS. 5 and 6 illustrate partial cross-sectional view of a semiconductor structure at different steps in fabrication in accordance with the present description. In some examples, the semiconductor structure can be semiconductor structure 10, semiconductor structure 20, or variations thereof. FIG. 5 illustrates region of semiconductor material 11 provided as an as-purchased substrate or wafer that includes a substrate portion 12A and an optional semiconductor region portion 12B that is formed over substrate portion 12A. In some examples, semiconductor region portion 12B can be an epitaxial layer that provides a region of lower defects at the top side surface of the as-purchased substrate. In the present example, substrate portion 12A includes or defines second major surface 11B of region of semiconductor material 11, and semiconductor region portion 12B includes or defines first major surface 11A of region of semiconductor material 11.

In some examples, semiconductor region portion 12B can comprises a P-type conductivity, can be doped with boron, and can have a resistivity in a range similar to that of substrate portion 12A (which can have a resistivity in a range from about 10 ohm-cm to about 40 ohm-cm). In some examples, semiconductor region portion 12B can have a thickness in a range from about 4.0 microns to about 6.0 microns.

FIG. 6 illustrates the semiconductor structure at a subsequent fabrication step. In some examples, ion implantation techniques can be used to ion implant dopant 1400 into region of semiconductor material 11 from first major surface 11A to provide doped region 14. As illustrated in FIG. 6, doped region 14 is provided spaced apart from first major surface 11A at depth 14A, which in some examples can be in a range from about 2.0 microns to about 6.0 microns. In some examples, depth 14A is less than about 2.5 microns. In some examples, phosphorous can be used as the dopant source when doped region 14 comprises an N-type conductivity. In some examples, an ion implantation dose or doses in a range from about $5.0\times10^{12}$ atoms/cm$^2$ to about $8.0\times10^{12}$ atoms/cm$^2$ can be used in an ion implantation energy in a range from about 3500 keV to about 4500 keV.

In accordance with the present description, after doped region 14 is formed within region of semiconductor material 11, no semiconductor layers are provided over first major surface 11A by epitaxial growth or similar deposition processes. More particularly, the individual semiconductor devices (for example, semiconductor devices, 100, 200, 300)

are formed within region of semiconductor material 11 between doped region 14 and first major surface 11A as illustrated in FIG. 6. In accordance with the present description, the structures and methods provide a cost effective isolation technique for isolating semiconductor devices 100 and 300 from the underlying substrate portion 12A.

In summary, semiconductor structures having improved substrate isolation while maintaining BV$_{DSS}$ performance and achieving desired Rsp performance and associated methods have been described. In some examples, the semiconductor structure comprises a double-RESURF LDMOS device with an integrated protection diode. The integrated protection diode provides electrical isolation of the drain of the LDMOS device from the substrate. The integrated production diode can occupy a small portion of the region for the LDMOS device portion of the semiconductor structure and, thus, has minimal impact on the R$_{SP}$ of the LDMOS device. This is beneficial when the LDMOS device is used, for example, as a power switch. In some examples, the semiconductor structure as described herein achieved less than 1% to 5% substrate injection, had an R$_{SP}$ of about 20 mohm·mm$^2$, and had a BV$_{DSS}$ of about 60 volts.

It is understood that the different examples described herein can be combined with any of the other examples described herein to obtain different embodiments.

While the subject matter of the invention is described with specific preferred examples, the foregoing drawings and descriptions thereof depict only typical examples of the subject matter and are not therefore to be considered limiting of its scope. It is evident that many alternatives and variations will be apparent to those skilled in the art. For example, the conductivity types of the various regions can be reversed. In addition, other isolation techniques can be used to isolate the active device regions. It is understood that the term semiconductor substrate can refer to an individual semiconductor die, a plurality of semiconductor die, or a semiconductor wafer.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some, but not other features included in other examples, combinations of features of different examples are meant to be within the scope of the invention and meant to form different examples as would be understood by those skilled in the art.

What is claimed is:

1. A semiconductor structure, comprising:
a region of semiconductor material comprising a first conductivity type, a first side, and a second side opposite to the first side;
a first doped region comprising a second conductivity type opposite to the first conductivity type within the region of semiconductor material spaced apart from the first side at a first depth;
a semiconductor device comprising at least a first part in a first portion of the region of semiconductor material between the first doped region and the first side and comprising a first current carrying region of the second conductivity type and a second current carrying region; and
a PN diode in a second portion of the region of semiconductor material and comprising an anode region of the first conductivity type and cathode region of the second conductivity type;

wherein:
the anode region is coupled to the first current carrying region of the semiconductor device;
the cathode region is coupled to the first doped region; and
the first doped region is configured to suppress current injection from the semiconductor device into the region of semiconductor material below the first doped region in response to a forward bias applied between the first current carrying region and the second current carrying region.

2. The semiconductor structure of claim 1, wherein:
the semiconductor device comprises an LDMOS device;
the first current carrying region comprises a drain region;
the second current carrying region comprises the second conductivity type; and
the second current carrying region comprises a source region.

3. The semiconductor structure of claim 2, further comprising:
a double RESURF structure comprising:
a second doped region of the second conductivity type in the first portion of the region of semiconductor material; and
a third doped region of the first conductivity type interposed between the second doped region and the first doped region;
wherein:
the first current carrying region is within the second doped region.

4. The semiconductor structure of claim 1, further comprising:
a contact region in the region of semiconductor material coupling the cathode region to the first doped region.

5. The semiconductor structure of claim 1, wherein:
the first doped region comprises an ion-implanted region.

6. The semiconductor structure of claim 1, wherein:
the first depth is less than about 2.5 microns.

7. The semiconductor structure of claim 1, wherein:
the semiconductor device comprises a second PN diode; and
the second current carrying region comprises the first conductivity type.

8. The semiconductor structure of claim 7, further comprising:
a double RESURF structure comprising:
a second doped region of the second conductivity type in the first portion of the region of semiconductor material; and
a third doped region of the first conductivity type interposed between the second doped region and the first doped region;
wherein:
the first current carrying region is within the second doped region.

9. The semiconductor structure of claim 1, wherein:
the first doped region laterally extends across the first portion and the second portion of the region of semiconductor material.

10. The semiconductor structure of claim 9, further comprising:
a second doped region of the first conductivity type in the region of semiconductor material vertically interposed between the PN diode and the first doped region.

11. A semiconductor structure, comprising:

a body of semiconductor material comprising a first conductivity type, a first side, and a second side opposite to the first side;

a first doped region within the body of semiconductor spaced apart from the first side and comprising a second conductivity type opposite the first conductivity type;

a first semiconductor device at least partially in a first portion of the body of semiconductor material between the first doped region and the first side and comprising:

a second doped region comprising the second conductivity type adjacent to the first side;

a first current carrying region comprising the second conductivity type within the second doped region;

a third doped region comprising the first conductivity type adjacent to the first side and laterally spaced apart from the second doped region;

a second current carrying region within the third doped region; and a fourth doped region comprising the first conductivity type vertically interposed between the second doped region and the first doped region; and a second semiconductor device in a second portion of the body of semiconductor material between the first doped region and the first side and comprising:

a fifth doped region comprising the first conductivity type; and a sixth doped region comprising the second conductivity type;

wherein:

the fifth doped region and the sixth doped region comprise a first PN diode;

the fifth doped region is coupled to the first current carrying region; and the sixth doped region is coupled to the first doped region.

12. The semiconductor structure of claim 11, wherein:

the second doped region and the fourth doped region comprise a double RESURF structure.

13. The semiconductor structure of claim 11, wherein:

the first semiconductor device comprises a double RESURF LDMOS device;

the first current carrying region comprises a drain region; and the second current carrying region comprises a second conductivity type source region.

14. The semiconductor structure of claim 11, wherein:

the first semiconductor device comprises a second PN diode comprising a higher breakdown voltage than the first PN diode; and the second current carrying region comprises the first conductivity type.

15. The semiconductor structure of claim 11, further comprising:

a contact region extending from the first side to the first doped region;

wherein:

the contact region couples the sixth doped region to the first doped region.

16. The semiconductor structure of claim 11, further comprising:

a seventh doped region of the first conductivity type vertically interposed between the second semiconductor device and the first doped region.

17. A method for making a semiconductor structure, comprising:

providing a region of semiconductor material comprising a first conductivity type, a first side, and a second side opposite to the first side;

providing a first doped region comprising a second conductivity type opposite to the first conductivity type within the region of semiconductor material spaced apart from the first side at a first depth;

providing a semiconductor device comprising at least a first part in a first portion of the region of semiconductor material between the first doped region and the first side and comprising a first current carrying region of the second conductivity type and a second current carrying region; and providing a PN diode in a second portion of the region of semiconductor material and comprising an anode region of the first conductivity type and a cathode region of the second conductivity type;

wherein:

the anode region is coupled to the first current carrying region of the semiconductor device;

the cathode region is coupled to the first doped region; and the first doped region is configured to suppress current injection from the semiconductor device into the region of semiconductor material below the first doped region in response to a forward bias applied to the first current carrying region.

18. The method of claim 17, wherein:

providing the semiconductor device comprises providing an LDMOS device;

the first current carrying region comprises a drain region;

the second current carrying region comprises the second conductivity type; and the second current carrying region comprises a source region.

19. The method of claim 17, further comprising:

providing a second doped region of the second conductivity type in the region of semiconductor material coupling the anode region to the first doped region.

20. The method of claim 17, wherein:

providing the region of semiconductor material comprises providing a semiconductor substrate with a semiconductor region;

the semiconductor region defines the first side; and providing the first doped region comprises ion implanting the first doped region into the semiconductor region through the first side.

* * * * *